US009780032B2

(12) United States Patent
Yamasaki et al.

(10) Patent No.: US 9,780,032 B2
(45) Date of Patent: Oct. 3, 2017

(54) WIRING SUBSTRATE

(71) Applicant: SHINKO ELECTRIC INDUSTRIES CO., LTD., Nagano-shi, Nagano-ken (JP)

(72) Inventors: Tomoo Yamasaki, Nagano (JP); Kazuhiro Fujita, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 15/381,964

(22) Filed: Dec. 16, 2016

(65) Prior Publication Data

US 2017/0186684 A1   Jun. 29, 2017

(30) Foreign Application Priority Data

Dec. 25, 2015  (JP) .................. 2015-255104

(51) Int. Cl.
*H01L 21/02* (2006.01)
*H01L 23/528* (2006.01)
*H01L 23/532* (2006.01)
*H01L 21/306* (2006.01)
*H01L 21/308* (2006.01)
*H01L 21/768* (2006.01)

(52) U.S. Cl.
CPC ...... *H01L 23/528* (2013.01); *H01L 21/02178* (2013.01); *H01L 21/02274* (2013.01); *H01L 21/308* (2013.01); *H01L 21/30604* (2013.01); *H01L 21/76852* (2013.01); *H01L 23/53228* (2013.01); *H01L 23/53233* (2013.01)

(58) Field of Classification Search
CPC .... H01L 21/02518; H01L 21/70; H01L 21/71
See application file for complete search history.

(56) References Cited

U.S. PATENT DOCUMENTS 6,812,110 B1 * 11/2004 Basceri ............ H01L 27/10852
257/E21.008

FOREIGN PATENT DOCUMENTS

JP   H05-144811 A   6/1993
JP   2003-023252 A   1/2003

* cited by examiner

*Primary Examiner* — Cheung Lee
(74) *Attorney, Agent, or Firm* — Tarolli, Sundheim, Covell & Tummino LLP

(57) ABSTRACT

A wiring substrate includes a first insulation layer, a wiring layer formed on an upper surface of the first insulation layer, a barrier film that covers the upper surface of the first insulation layer, an upper surface of the wiring layer, and side surfaces of the wiring layer, and a second insulation layer that covers an upper surface of the barrier film and side surfaces of the barrier film. The barrier film is an alumina film containing carbon atoms, and the alumina film has a carbon atom content rate that is in the range of 0.2 atomic % to 3.6 atomic %.

5 Claims, 11 Drawing Sheets

Fig. 11

| | ALD Temperature | Carbon Atom Content Rate | Delamination | Cu Wiring Corrosion | Insulation Deterioration Between Wires | Wiring Resistance Increase Rate |
|---|---|---|---|---|---|---|
| Sample 1 | 30°C | 3.6 atomic% | None | None | All OK | 2.6% |
| Sample 2 | 50°C | 2.0 atomic% | None | None | All OK | 3.3% |
| Sample 3 | 80°C | 0.4 atomic% | None | None | All OK | 2.5% |
| Sample 4 | 90°C | 0.2 atomic% | None | None | All OK | 2.8% |
| Sample 5 | 110°C | 0.1 atomic% | Confirmed | Confirmed | All OK | 8.6% |
| Sample 6 | 130°C | Detection Limit or Less | Confirmed | Confirmed | 1 out of 5 NG | 10.8% |

WIRING SUBSTRATE

CROSS-REFERENCE TO RELATED APPLICATIONS

This application is based upon and claims the benefit of priority from prior Japanese Patent Application No. 2015-255104, filed on Dec. 25, 2015, the entire contents of which are incorporated herein by reference.

FIELD

This disclosure relates to a wiring substrate and a method for manufacturing a wiring substrate.

BACKGROUND

Electronic components such as semiconductor elements are mounted on wiring substrates. A wiring substrate that undergoes a build-up process stacks wiring layers and insulation layers on the upper and lower surfaces of a wiring substrate to increase the density of wiring patterns. Japanese Laid-Open Patent Publication Nos. 2003-023252 and 05-144811 each describe examples of such a wiring substrate.

In such type of a wiring substrate, a roughening process is performed on each wiring layer to improve adhesion with the corresponding insulation layer that covers the wiring layer.

The roughening process changes the wiring layers in shape more greatly as the wiring layers become finer. Thus, the desired shapes of the fine wiring layers may not be maintained when performing the roughening process. When omitting the roughening process to avoid such a situation, the adhesion will decrease between the wiring layer and the insulation layer covering the wiring layer. In such a case, delamination is apt to occur at the interface of the wiring layer and the insulation layer. The occurrence of such a delamination may lead to corrosion of the wiring layer when conducting a reliability test such as the biased Highly-Accelerated Temperature and Humidity Stress Test (biased HAST).

SUMMARY

One embodiment of this disclosure is a wiring substrate. The wiring substrate includes a first insulation layer and a wiring layer formed on an upper surface of the first insulation layer. The wiring substrate also includes a barrier film that covers the upper surface of the first insulation layer, an upper surface of the wiring layer, and side surfaces of the wiring layer. The wiring substrate also includes a second insulation layer that covers an upper surface of the barrier film and side surfaces of the barrier film. The barrier film is an alumina film containing carbon atoms, and the alumina film has a carbon atom content rate in the range of 0.2 atomic % to 3.6 atomic %.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 11 is a table illustrating the evaluation results of the strength of adhesion between a barrier film and an insulation layer.

DESCRIPTION OF THE EMBODIMENTS

Figure 1A:
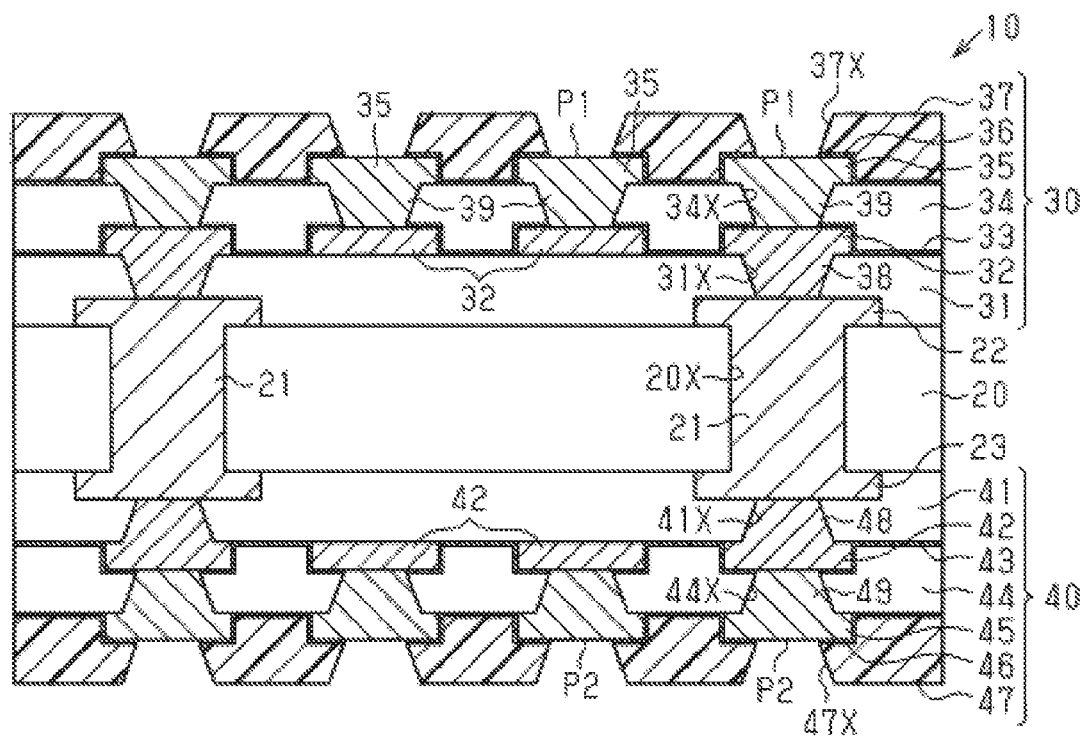
FIG. 1A is a schematic cross-sectional view illustrating one embodiment of a wiring substrate.

One embodiment will now be described with reference to the drawings. In the drawings, elements are illustrated for simplicity and clarity and have not necessarily been drawn to scale. To facilitate understanding, hatching lines may not be shown or be replaced by shadings in the cross-sectional drawings.

As illustrated in FIG. 1A, a wiring substrate 10 includes a core substrate 20, a wiring structure 30 formed on the upper surface of the core substrate 20, and a wiring structure 40 formed on the lower surface of the core substrate 20.

The core substrate 20 may be, for example, a glass epoxy substrate formed by impregnating a glass cloth (glass fabric), which is a reinforcement material, with a thermosetting resin, the main component of which is an epoxy resin, and hardening the thermosetting resin.

The core substrate 20 includes through holes 20X that extend through the core substrate 20 from the upper surface to the lower surface at given locations. A through electrode 21 is formed in each through hole 20X.

A wiring layer 22 is formed on the upper surface of the core substrate 20. A wiring layer 23 is formed on the lower surface of the core substrate 20. The through electrodes 21 electrically connect the wiring layers 22 and 23. The through electrodes 21 and the wiring layers 22 and 23 may be formed from, for example, copper (Cu) or a copper alloy.

The wiring structure 30 includes high-density wiring layers that have a higher wiring density than, for example, the wiring layers 22 and 23 of the core substrate 20. The wiring structure 30 is a stack of an insulation layer 31, a wiring layer 32, a barrier film 33, an insulation layer 34, a wiring layer 35, a barrier film 36, and a solder resist layer 37 that are formed on the upper surface of the core substrate 20 in this order. The insulation layers 31 and 34 may be formed from, for example, an insulative resin of which the main component is a photosensitive resin such as a phenol resin or a polyimide resin. The insulation layers 31 and 34 may also be formed from, for example, an insulative resin of which the main component is a thermosetting resin such as an epoxy resin. The insulation layers 31 and 34 may contain, for example, a filler such as silica. Instead of silica, an inorganic compound may be used as the filler such as silicon oxide, silicon nitride, silicon carbide, alumina, aluminum nitride, or aluminum oxide. The wiring layers 32 and 35 may be formed from, for example, copper or a copper alloy. The solder resist layer 37 may be formed from, for example, a photosensitive insulative resin of which the main component is a phenol resin or a polyimide resin.

The wiring layers 32 and 35 are thinner than the wiring layers 22 and 23. The wiring layers 32 and 35 each have a thickness of, for example, approximately 1 to 5 μm. Further, the wiring layers 32 and 35 each have a smaller wiring width than the wiring layers 22 and 23, and the wiring layers 32 and 35 are laid out to have wire intervals that are smaller than that of the wiring layers 22 and 23. The wiring layers 32 and 35 may each have a line and space (L/S) of, for example, 2 μm/2 μm or less. The line and space (L/S) is defined by wire width (L)/wire interval (S). The insulation layers 31 and 34 are thinner than the core substrate 20. The insulation layers 31 and 34 may each have a thickness of, for example, approximately 3 to 10 μm.

The wiring layer 32 is formed on the upper surface of the insulation layer 31, and the wiring layer 35 is formed on the upper surface of the insulation layer 34. The insulation layers 31 and 34 include via holes 31X and 34X that extend through the insulation layers 31 and 34, respectively. A via wiring 38 formed in each via hole 31X electrically connects the wiring layer 22 and the wiring layer 32. A via wiring 39 formed in each via hole 34X electrically connects the wiring layer 32 and the wiring layer 35. The solder resist layer 37 includes openings 37X that expose portions of the upper surface the wiring layer 35 as connection pads P1. The connection pads P1 function as electronic component mounting pads used for electrical connection of electronic components such as semiconductor chips.

Figure 1B:
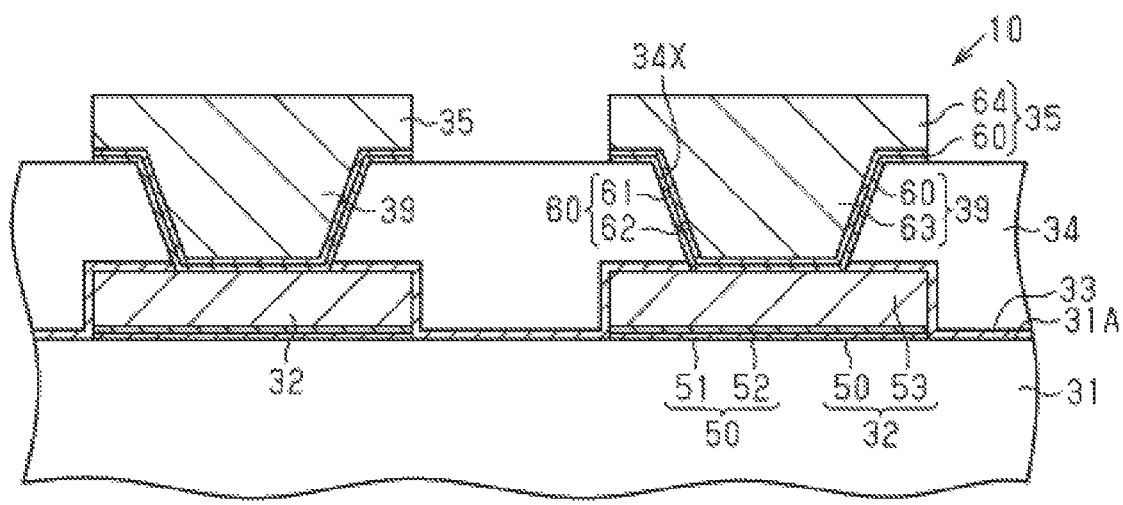
FIG. 1B is a partially, enlarged cross-sectional view of the wiring substrate illustrated in FIG. 1A.

As illustrated in FIG. 1B, the wiring layer 32 includes, for example, a seed layer 50 that is formed on an upper surface 31A of the insulation layer 31 and a metal layer 53 that is formed on the seed layer 50.

In the present example, the seed layer 50 has a double-layer structure including a metal film 51 that covers the upper surface 31A of the insulation layer 31 and a metal film 52 that covers the upper surface of the metal film 51. The metal films 51 and 52 may each be a sputtered film formed through sputtering. The metal film 51 functions as a metal barrier film that limits the diffusion of Cu in the insulation layer 31 from the metal film 52 and the metal layer 53 (e.g., Cu layer). It is preferred that the metal film 51 be formed from a metal having a higher adhesion to the insulation layer 31 than the metal (e.g., Cu) of the metal film 52. It is also preferred that the metal film 51 be formed from a metal having a higher corrosion resistance than the metal (e.g., Cu) of the metal film 52. Examples of the material of the metal film 51 include titanium (Ti), titanium nitride (TiN), tantalum nitride (TaN), tantalum (Ta), and chromium (Cr). The metal film 52 may be formed from, for example, copper or a copper alloy. The metal film 51 may have a thickness of, for example, approximately 20 to 50 nm. The metal film 52 may have a thickness of, for example, approximately 100 to 300 nm.

The metal layer 53 covers the upper surface of the seed layer 50 (metal film 52). The metal layer 53 may be formed from, for example, copper or a copper alloy. The metal layer 53 may have a thickness of, for example, approximately 1 to 5 μm.

The barrier film 33 covers the entire upper surface 31A of the insulation layer 31 that is outside the wiring layer 32, all of the side surfaces of the wiring layer 32, and the entire upper surface of the wiring layer 32 that is not exposed by the via holes 34X. The barrier film 33 limits the diffusion of metal from the wiring layer 32 to the insulation layers 31 and 34. For example, the barrier film 33 limits the diffusion of Cu from the metal film 52 and the metal layer 53 (e.g., Cu layer) to the insulation layer 31. The barrier film 33 may be formed from alumina ($Al_2O_3$). The barrier film 33 (alumina film) includes carbon (C). For example, the barrier film 33 contains carbon atoms, the amount of which is detectable through X-ray photoelectron spectroscopy (XPS). The barrier film 33 (alumina film) has a carbon atom content rate (carbon content rate, namely, carbon atom concentration), which is measured through XPS, preferably in the range from 0.2 to 10.0 atomic %, more preferably in the range from 0.2 to 3.6 atomic %, and even more preferably in the range from 0.2 to 2.0 atomic %. The barrier film 33 may have a thickness of, for example, approximately 3 to 20 nm.

When the barrier film 33 contains the same carbon atoms as the resin components of the insulation layers 31 and 34, the adhesion of the barrier film 33 with the insulation layers 31 and 34 may be improved. This reduces delamination at the interface of the barrier film 33 and the insulation layer 34, that is, the interface of the wiring layer 32 and the insulation layer 34.

The insulation layer 34 covers the upper surface and the side surfaces of the barrier film 33. The via holes 34X extend through the insulation layer 34 and the barrier film 33 in the thickness-wise direction and expose portions of the upper surface of the wiring layer 32 (metal layer 53).

A seed layer 60 is formed on the inner surface of each via hole 34X. The inner surface of the via hole 34X includes the wall surface of the via hole 34X (i.e., inner side surface of insulation layer 34 defining via hole 34X) and the upper surface of the wiring layer 32 that is exposed by the via hole 34X. The seed layer 60 has a double-layer structure that includes a metal film 61 and a metal film 62. The metal film 61 continuously covers the inner surface of the via hole 34X and the upper surface of the insulation layer 34. The metal film 62 covers the upper surface of the metal film 61. The metal film 61 and the metal film 51 may be formed from the same material, and the metal film 62 and the metal film 52 may be formed from the same material. The via hole 34X, which includes the seed layer 60, is filled with the metal layer 63. A metal layer 64 is formed on the upper surface of the metal layer 63. The metal layer 64 is also formed on the seed layer 60 that is located on the insulation layer 34. For example, the metal layer 63 is formed integrally with the metal layer 64. The metal layers 63 and 64 may be formed from the same material as the metal layer 53.

The seed layer 60 and the metal layer 63 that are located in each via hole 34X form the via wiring 39. The seed layer 60 and the metal layer 64 that are located on the upper surface of the insulation layer 34 form the wiring layer 35.

As illustrated in FIG. 1A, the barrier film 36 covers the entire upper surface of the insulation layer 34, all of the side surfaces of the wiring layer 35, and the entire upper surface of the wiring layer 35 that is not exposed by the openings 37X. The barrier film 36 may be made from the same material as the barrier film 33.

The wiring structure 40 includes low-density wiring layers that have a lower wiring density than, for example, the wiring structure 30. The wiring structure 40 is a stack of an insulation layer 41, a wiring layer 42, a barrier film 43, an insulation layer 44, a wiring layer 45, a barrier film 46, and a solder resist layer 47 that are formed on the lower surface of the core substrate 20 in this order.

The insulation layers 41 and 44 may be formed from, for example, the same material as the insulation layers 31 and 34. The wiring layers 42 and 45 may be formed from, for example, the same material as the wiring layers 32 and 35. The barrier films 43 and 46 may be formed from the same material as the barrier film 33. The solder resist layer 47 may be formed from, for example, the same material as the solder resist layer 37.

The wiring layer 42 is formed on the lower surface of the insulation layer 41, and the wiring layer 45 is formed on the lower surface of the insulation layer 44. The insulation layers 41 and 44 include via holes 41X and 44X that extend through the insulation layers 41 and 44, respectively. A via wiring 48 formed in each via hole 41X electrically connects the wiring layer 23 and the wiring layer 42. A via wiring 49 formed in each via hole 44X electrically connects the wiring layer 42 and the wiring layer 45. The solder resist layer 47 includes openings 47X that expose portions of the lower surface the wiring layer 45 as external connection pads P2. External connection terminals are connected to the external connection pads P2 when mounting the wiring substrate 10 on a mounting substrate such as a motherboard. The portions of the wiring layer 45 exposed by the openings 47X may be used as the external connection terminals. The barrier film 43 covers the entire lower surface of the insulation layer 41, all of the side surfaces of the wiring layer 42, and the entire lower surface of the wiring layer 42 that is not exposed by the via holes 44X. The barrier film 46 covers the entire lower surface of the insulation layer 44, all of the side surfaces of the wiring layer 45, and the entire lower surface of the wiring layer 45 that is not exposed by the openings 47X.

The via wirings 38, 48, and 49 each have the same structure as the via wiring 39 of FIG. 1B and thus will not be described.

A method for manufacturing the wiring substrate 10 will now be described. A method for manufacturing the structure of the wiring substrate 10 illustrated in FIG. 1B will be described.

Figure 2A:
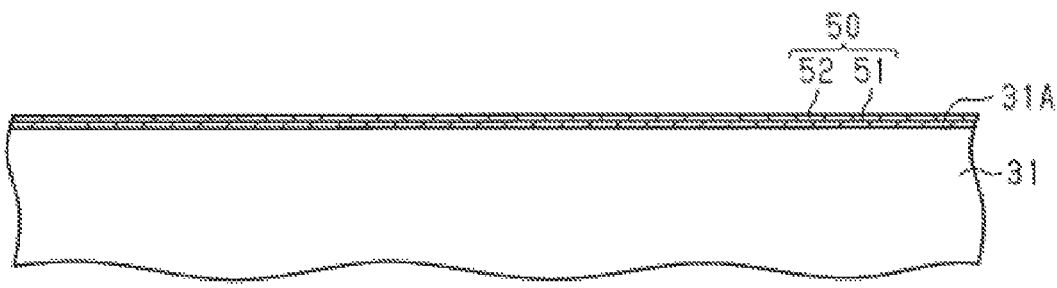
FIGS. 2A to 2C, 3A to 3C, 4A to 4C, 5A, and 5B are schematic cross-sectional views illustrating a method for manufacturing the wiring substrate of FIG. 1A.

First, in the step illustrated in FIG. 2A, the seed layer 50 is formed on the entire upper surface 31A of the insulation layer 31. The seed layer 50 may be formed through, for example, sputtering or electroless plating. In the present example, the seed layer 50 is formed through sputtering. In this case, titanium is first deposited through sputtering on the entire upper surface 31A of the insulation layer 31 to form the metal film 51 (Ti layer). Then, copper is deposited through sputtering on the metal film 51 to form the metal film 52 (Cu layer). This forms the seed layer 50 that has a double-layer structure (Ti layer/Cu layer).

When forming the seed layer 50 through electroless plating, for example, electroless copper plating may be performed to form the seed layer 50 that has a double-layer structure (Ni layer/Cu layer) of the metal film 51 (Ni layer) and the metal film 52 (Cu layer).

Figure 2B:
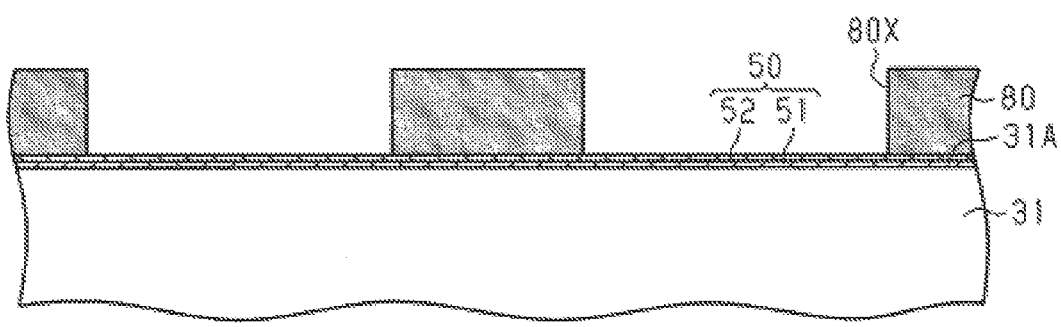

In the step illustrated in FIG. 2B, a resist layer 80 including an opening pattern 80X that is open at given locations is formed on the seed layer 50. The opening pattern 80X exposes portions of the seed layer 50 corresponding to the region where the wiring layer 32 (refer to FIG. 1B) is formed. The resist layer 80 may be formed from a material that is, for example, resistant to plating that is performed in the following step. For example, the resist layer 80 may be formed by a photosensitive dry film resist or a photoresist liquid. Examples of such resist materials include novolac resins and acrylic resins. For example, when using a photosensitive dry film resist, a dry film is thermally compressed and laminated to the upper surface of the metal film 52. Then, the dry film is patterned through photolithography to form the resist layer 80 including the opening pattern 80X. When using the photoresist liquid, the same steps are performed to form the resist layer 80.

Figure 2C:
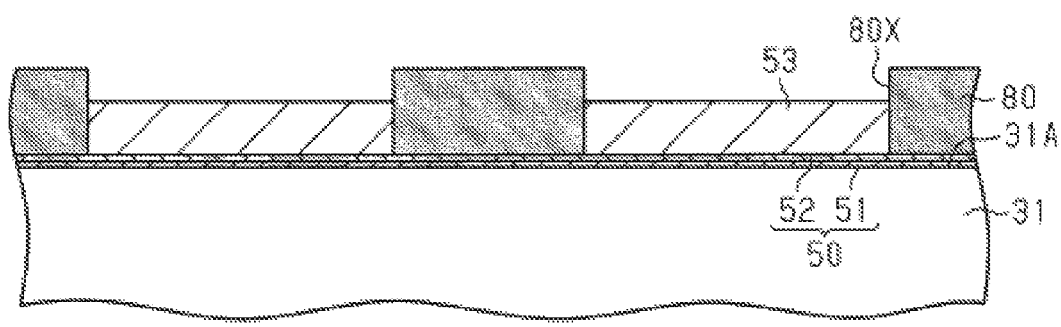

In the step illustrated in FIG. 2C, electrolytic plating (here, electrolytic copper plating) is performed using the resist layer 80 as a plating mask and the seed layer 50 as a plating power supplying layer to form the metal layer 53 (electrolytic copper plating metal layer) on the upper surface of the seed layer 50 that is exposed by the opening pattern 80X of the resist layer 80. The metal layer 53 may also be formed, for example, through sputtering or by laminating a copper foil.

Figure 3A:
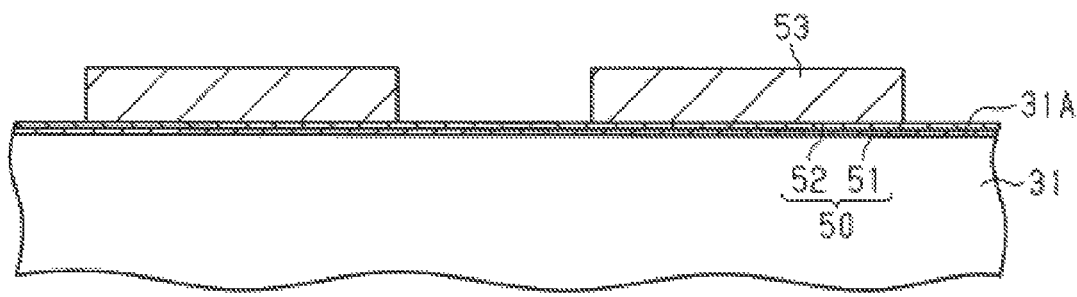
Figure 3B:
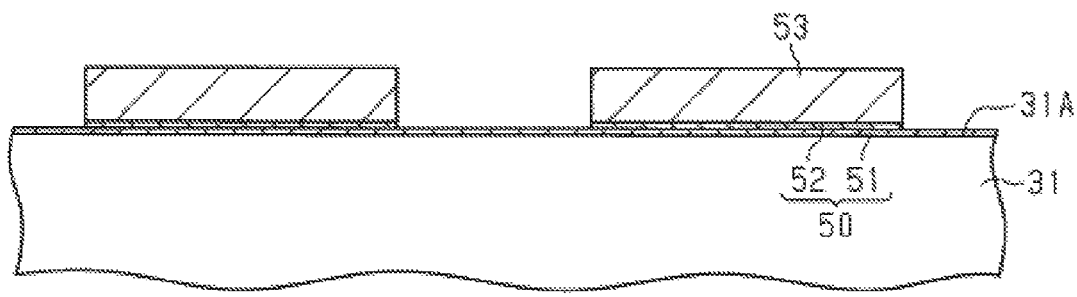
Figure 3C:
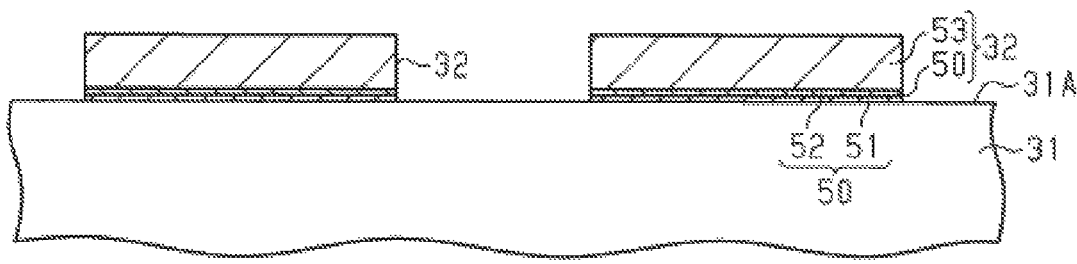

In the step illustrated in FIG. 3A, the resist layer 80 illustrated in FIG. 2C is removed with, for example, an alkali delamination liquid. In the step illustrated in FIG. 3B, unnecessary portions of the metal film 52 are removed by performing etching (e.g., wet etching) using the metal layer 53 as an etching mask. The etching liquid for wet etching may be, for example, an acid aqueous solution such as sulfuric acid peroxide liquid (mixed aqueous solution of sulfuric acid and hydrogen peroxide). In the step illustrated in FIG. 3C, unnecessary portions of the metal film 51 are removed by performing etching using the metal layer 53 as an etching mask. For example, when the metal film 51 is formed from Ti, the metal film 51 is removed through dry etching, which uses an etching gas such as carbon tetrafluoride ($CF_4$) or wet etching that uses a potassium hydroxide (KOH) etching liquid. This forms the wiring layer 32, which includes the seed layer 50 (metal films 51 and 52) and the metal layer 53, on the upper surface 31A of the insulation layer 31. The line and space of the wiring layer 32 is 2 μm/2 μm or less.

Figure 4A:
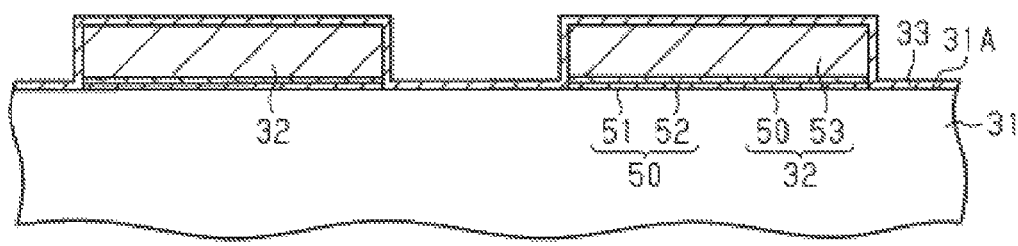

In the step illustrated in FIG. 4A, the barrier film 33 is formed on the entire upper surface and all of the side surfaces of the wiring layer 32 and on the entire upper surface 31A of the insulation layer 31 that is not covered by the wiring layer 32. The barrier film 33 may be formed through, for example, an atomic layer deposition (ALD) process that allows for the formation of a uniform thin film at the atomic level. The ALD process is a film formation method in which a thin film is grown one layer at a time at the atomic level by alternatively using a precursor and a reaction gas to cause atom adsorption, at a substrate surface, and a following chemical reaction. The principle for forming an alumina ($Al_2O_3$) film on the insulation layer 31 through the ALD process will now be briefly described. When forming the alumina film, trimethylaluminium (TMA), which is a highly active gas, is used as the precursor, and $H_2O$ is used as the reaction gas.

Figure 8A:
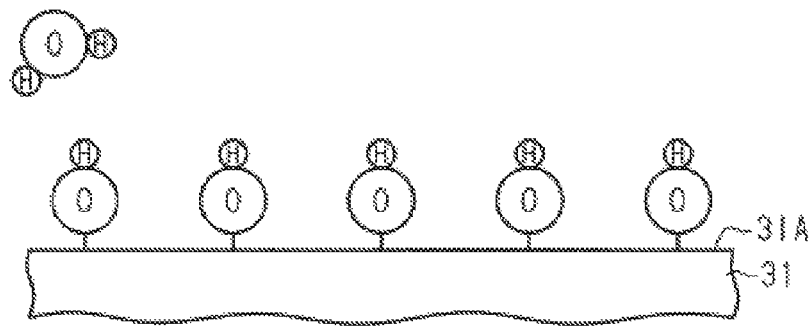
FIGS. 8A to 8C, 9A, and 9B are diagrams illustrating an ALD process in the related art.
Figure 8B:
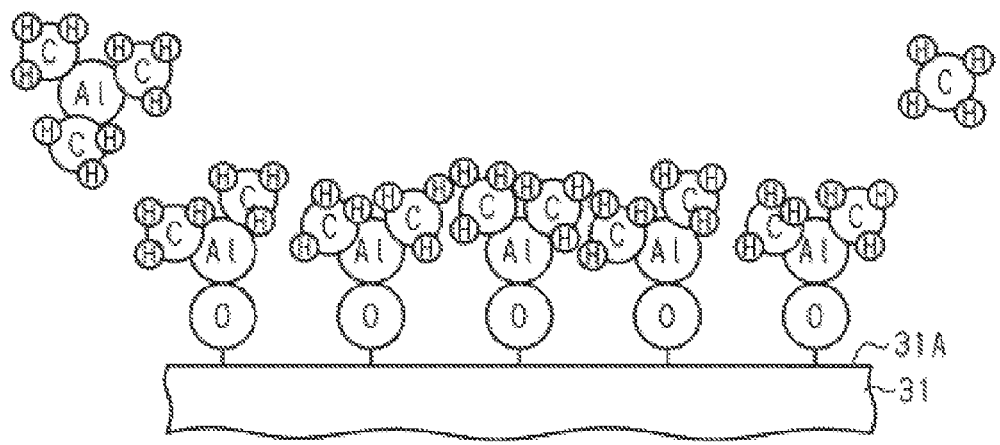
Figure 8C:
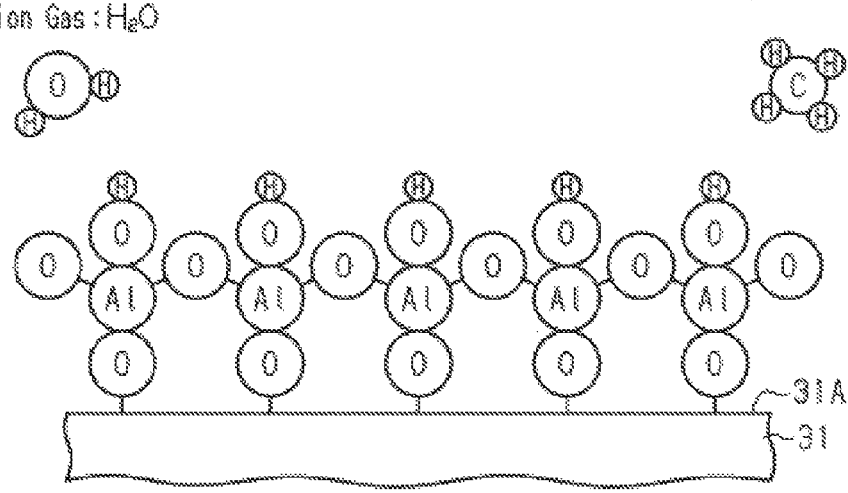
Figure 9A:
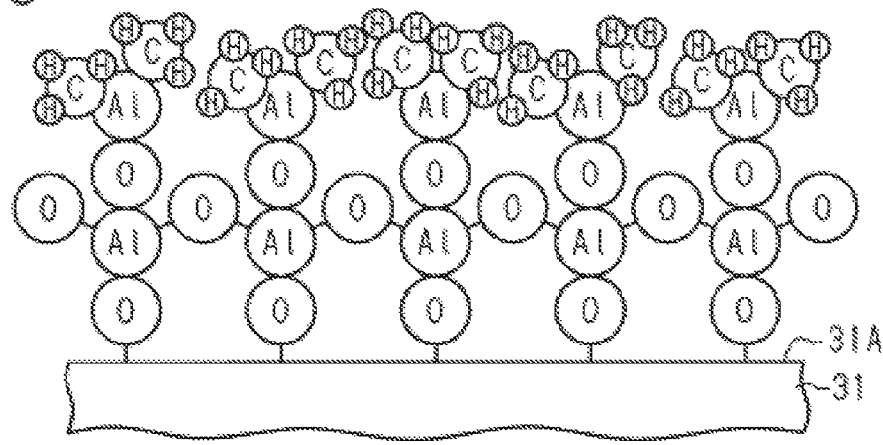
Figure 9B:
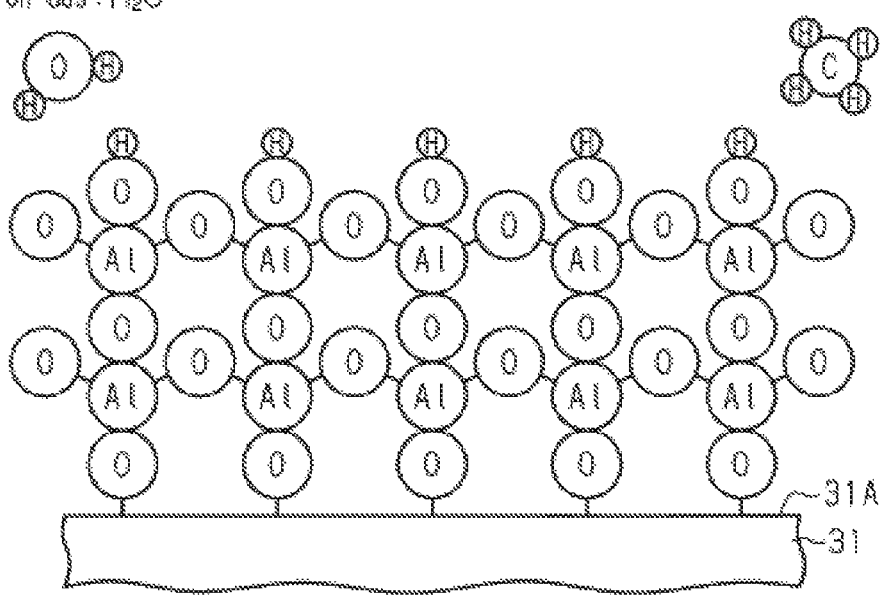

Referring to FIG. 8A, when $H_2O$ is supplied as the reaction gas, OH groups are adsorbed on the upper surface 31A of the insulation layer 31. Then, referring to FIG. 8B, when trimethylaluminium (TMA) is supplied as the precursor, the Al atoms of TMA chemically react with the O atoms adsorbed on the insulation layer 31, and methane ($CH_4$) is generated as a reaction product. Referring to FIG. 8C, when $H_2O$ is supplied as the reaction gas, the O atoms of $H_2O$ react with the Al atoms on the insulation layer 31, and $CH_4$ is generated as a reaction product. Such a reaction cycle forms a single layer of an alumina ($Al_2O_3$) film on the upper surface 31A of the insulation layer 31. Then, referring to FIGS. 9A and 9B, the reaction cycle described above is repeated so that two layers of the alumina film is formed on the upper surface 31A of the insulation layer 31. The reaction cycle is repeated a given number of times to form the alumina film having the desired thickness on the upper surface 31A of the insulation layer 31.

In the conventional ALD process, the temperature at which the alumina film is formed (e.g., temperature of film formation compartment in ALD apparatus) is set to a high temperature of approximately 130° C. to 250° C. However, the inventors have noticed that the formation of the alumina film at a high temperature decreases the strength of the adhesion between the alumina film and the insulation layer 34 (refer to FIG. 1B) formed in a subsequent step. In particular, when the wiring layer 32 becomes finer and the line and space of the wiring layer 32 becomes 2 μm/2 μm or less, delamination is apt to occur at the interface of the alumina film and the insulation layer 34, that is, the interface of the wiring layer 32 and the insulation layer 34.

In this regard, the inventors have found that the strength of the adhesion between the alumina film and the insulation layer 34 is increased when the alumina film contains carbon atoms. Further, the inventors have found that carbon atoms may be contained in the alumina film by setting a low film formation temperature for the ALD process.

Thus, in the ALD process of the present embodiment, TMA is used as the precursor, $H_2O$ is used as the reaction gas, and the film formation temperature is set to a low temperature of 90° or less (preferably, in a range from 30° C. to 90° C. and more preferably in a range of 50° C. to 90° C.). In this manner, by setting a low film formation temperature (reaction temperature) for the ALD process, an alumina film containing carbon atoms is formed as the barrier film 33 on the upper surface 31A of the insulation layer 31 and the surfaces of the wiring layer 32.

The principle under which the barrier film 33 is formed when setting a low film formation temperature will now be described.

Figure 6A:
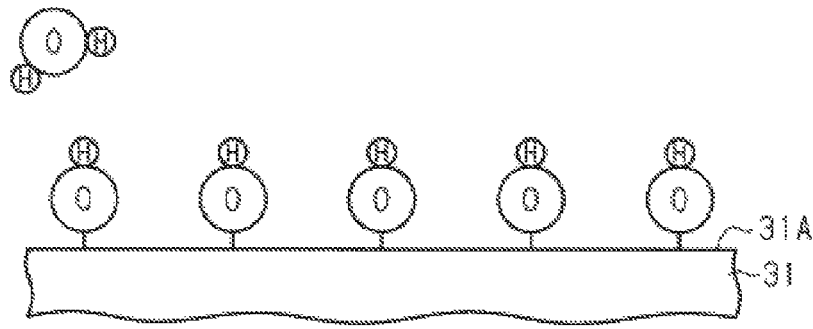
FIGS. 6A to 6C, 7A, and 7B are diagrams illustrating an ALD process in one embodiment.
Figure 6B:
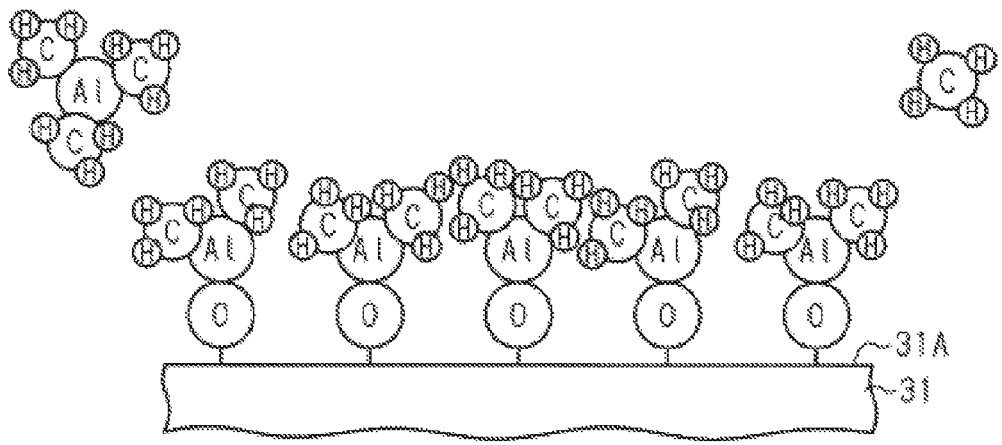
Figure 6C:
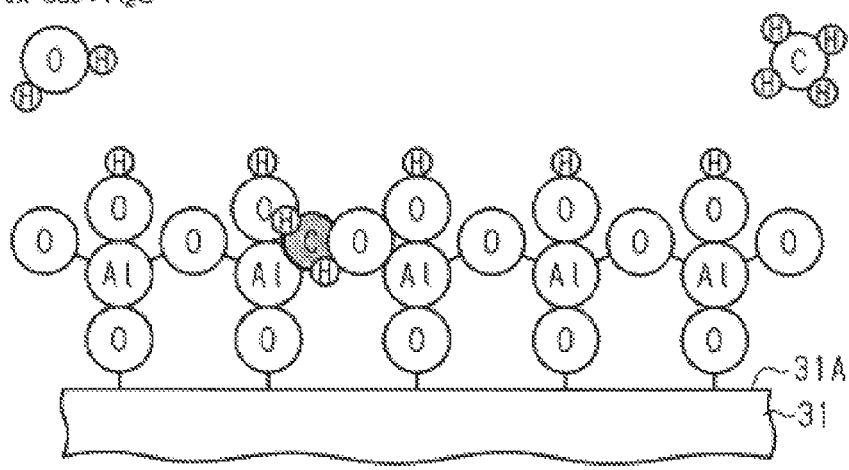
Figure 7A:
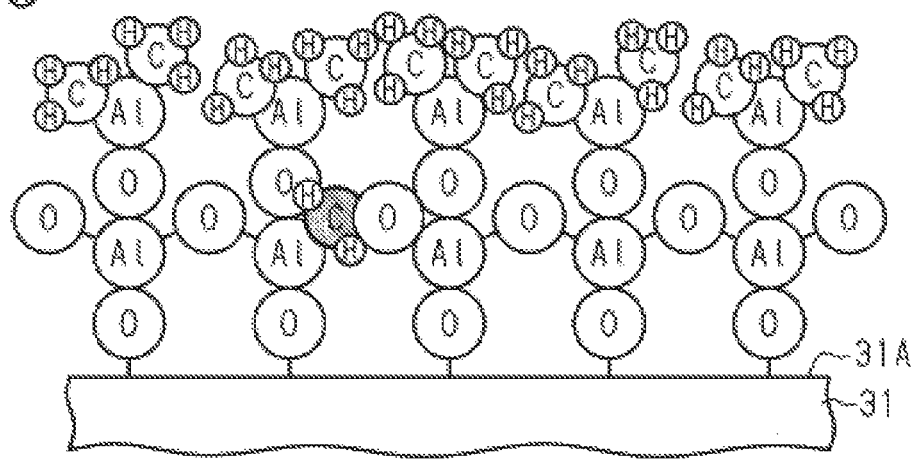
Figure 7B:
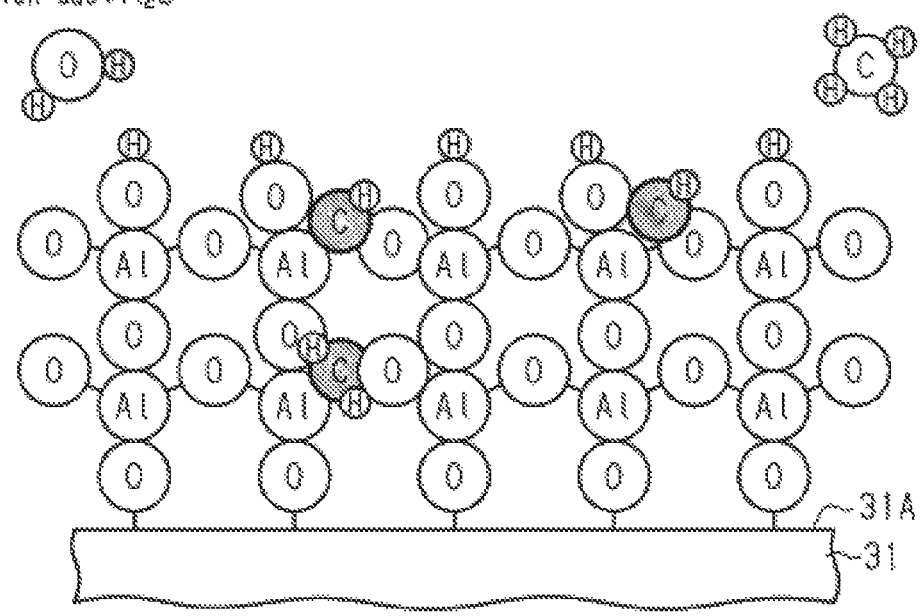

With reference to FIG. 6A, when $H_2O$ is supplied as the reaction gas, OH groups are adsorbed on the upper surface 31A of the insulation layer 31. Then, referring to FIG. 6B, when trimethylaluminium (TMA) is supplied as the precursor, the Al atoms of TMA chemically react with the O atoms adsorbed on the insulation layer 31 and methane ($CH_4$) is generated as a reaction product. Referring to FIG. 6C, when $H_2O$ is supplied as the reaction gas, the O atoms of $H_2O$ react with the Al atoms on the insulation layer 31 and $CH_4$ is generated as a reaction product. In this case, when the film formation temperature is set to a low temperature of 90° C. or less, the reaction temperature decreases. Thus, it is presumed that $CH_X$ groups (refer to shaded portion in FIG. 6C) remain in the Al atoms on the insulation layer 31. As a result, the reaction cycle described above forms a single layer of an alumina film containing carbon atoms on the upper surface 31A of the insulation layer 31. Then, referring to FIG. 7A, when TMA is supplied as the precursor, the Al atoms of TMA react with the O atoms on the insulation layer 31 and $CH_4$ is generate as a reaction product. Referring to FIG. 7B, when $H_2O$ is supplied as the reaction gas, the O atoms of $H_2O$ react with the Al atoms on the insulation layer 31 and $CH_4$ is generated as a reaction product. Here, the film formation temperature is set to a low temperature of 90° C. or less. Thus, in the same manner as described above, it is presumed that $CH_X$ groups (refer to shaded portion in FIG. 7B) remain in the Al atoms on the insulation layer 31. Such a reaction cycle is repeated a given number of times to form the alumina film (i.e., barrier film 33) that contains carbon atoms on the upper surface 31A of the insulation layer 31. Accordingly, the barrier film 33 formed in such a manner contains $CH_X$ groups that are bonded with the Al atoms of the alumina film.

The principle for forming the barrier film 33 on the upper surface 31A of the insulation layer 31 has been described. The same principle may be applied for the formation of the barrier film 33 on the surfaces (upper surface and side surfaces) of the wiring layer 32.

The results of an experiment conducted to prove that an alumina film containing carbon atoms is formed by setting a low film formation temperature will now be described.

[Experiment Conditions]

First, ten types of samples were prepared for evaluation. In each sample, an alumina film having a thickness of 20 nm was formed on the upper surface 31A of the insulation layer 31 through an ALD process using TMA as a precursor and $H_2O$ as a reaction gas. The film formation temperature of the ALD process was set to a different temperature for each sample. In this experiment, the film formation temperature of samples A, B, C, D, E, F, G, H, I, and J was set to 30° C., 50° C., 70° C., 80° C., 90° C., 110° C., 130° C., 180° C., 230° C., and 250° C., respectively. The film formation conditions of the ALD process other than the film formation temperature were set to be the same for every one of the samples A to J.

Then, X-ray photoelectron spectroscopy (XPS) was conducted on every one of the samples A to J to measure the content rate of carbon atoms in the alumina film formed on the insulation layer 31. The measurement conditions for XPS will now be described. Quantera SXM manufactured by ULVAC-PHI, Inc. was used as an X-ray photoelectron spectroscopy analyzer. First, the sample surfaces (surface of alumina film) were sputtered (etched) and cleaned with argon (Ar) ions under the sputtering conditions in which the acceleration voltage was 3 kV and the sputtering time was 60 seconds. The sputtering time was set to allow for stable detection of aluminum (Al) and oxygen (O) in the alumina film through XPS. After performing sputtering over the sputtering time, the carbon atom rate in the alumina film was measured every 12 seconds for a number of times (here, five times). More specifically, the carbon atom rate was measured through XPS at a number of (here, five) locations in the alumina film at different depths from the surface of the alumina film. The average value of the plurality of (here, five) measured carbon atom content rates was calculated for each of the samples A to J as the carbon atom content rate. In the description hereafter, the carbon atom content rate (average value) obtained through the XPS will simply be referred to as the carbon atom content rate.

[Experiment Results]

The following indicates the carbon atom content rate of each of the samples A to J obtained through the XPS.

Sample A (film formation temperature 30° C.): carbon atom content rate=3.6 atomic %

Sample B (film formation temperature 50° C.): carbon atom content rate=2 atomic %

Sample C (film formation temperature 70° C.): carbon atom content rate=0.9 atomic %

Sample D (film formation temperature 80° C.): carbon atom content rate=0.4 atomic %

Sample E (film formation temperature 90° C.): carbon atom content rate=0.2 atomic %

Sample F (film formation temperature 110° C.): carbon atom content rate=0.1 atomic %

Sample G (film formation temperature 130° C.): carbon atom content rate=0 atomic %

Sample H (film formation temperature 180° C.): carbon atom content rate=0 atomic %

Sample I (film formation temperature 230° C.): carbon atom content rate=0 atomic %

Sample J (film formation temperature 250° C.): carbon atom content rate=0 atomic %

Figure 10:
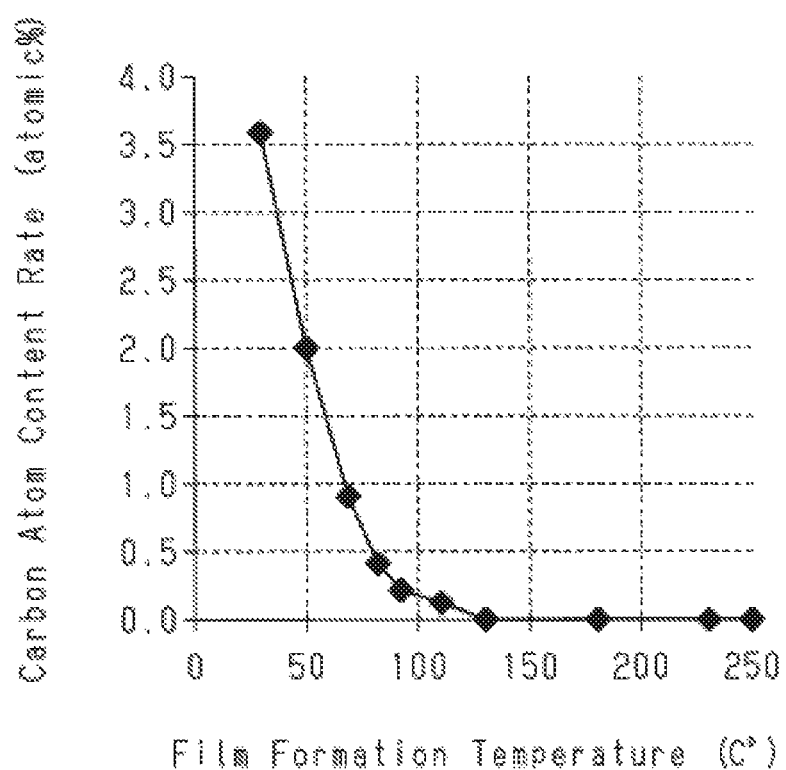
FIG. 10 is a graph illustrating the relationship of the film formation temperature for the ALD process and the carbon atom content rate of an alumina film.

FIG. 10 is a graph obtained by plotting the experiment results. As illustrated in FIG. 10, the carbon atom content rate of the alumina film increases as the film formation temperature of the alumina film decreases. When setting the film formation temperature to a high temperature of 130° C. of higher like in the conventional ALD process (samples G to J), the carbon atom content rate of the alumina film was less than or equal to the detection limit of the XPS (here, less than 0.1 atomic %). In contrast, when setting the film formation temperature of the ALD process to a low temperature of 110° C. or less, the carbon atom content rate of the alumina film increased as the film formation temperature decreased.

The experiment results prove that when setting the film formation temperature to 90° C. or less to form the barrier film 33 illustrated in FIG. 4A, an alumina film (barrier film 33) containing carbon atoms is formed on the surfaces of the insulation layer 31 and the wiring layer 32.

Figure 4B:
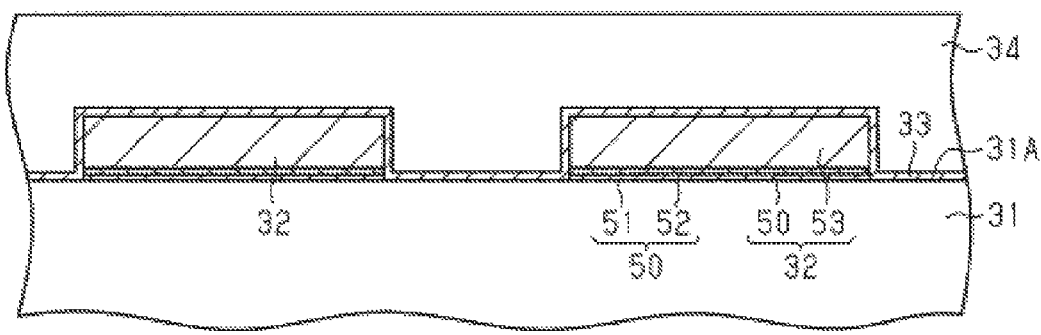

In the step illustrated in FIG. 4B, the insulation layer 34 is formed on the barrier film 33. The insulation layer 34 covers the entire surface of the barrier film 33. For example, when using a resin film as the insulation layer 34, the resin film is thermally compressed and laminated onto the barrier film 33 to form the insulation layer 34. Alternatively, when using insulative resin that is in the form of a liquid or a paste as the insulation layer 34, the insulative resin liquid or paste is applied to the barrier film 33 through spin coating to form the insulation layer 34.

The surface of the barrier film 33 contains the same carbon atoms as the resin components of the insulation layer 34. This increases the strength of the adhesion between the barrier film 33 and the insulation layer 34.

Figure 4C:
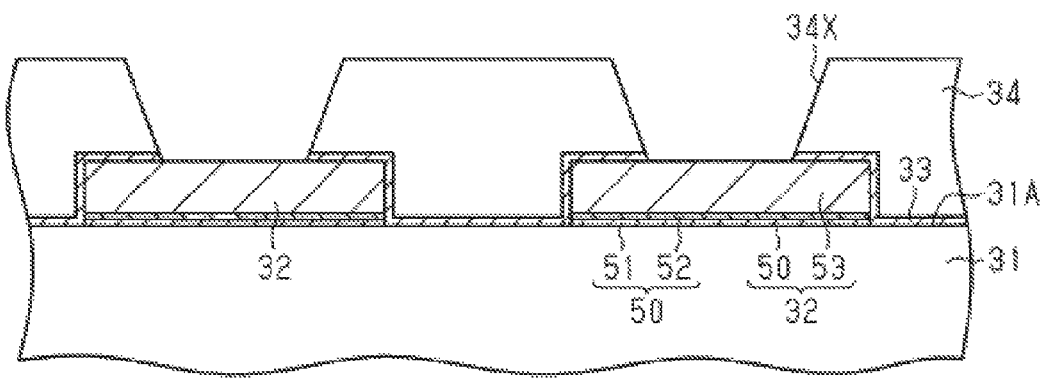

In the step illustrated in FIG. 4C, the via holes 34X are formed extending through the insulation layer 34 and the barrier film 33 in the thickness-wise direction. The via holes 34X may be formed through laser processing using a $CO_2$ laser, a YAG laser, or the like. Alternatively, the via holes 34X may be formed by performing photolithography to form through holes extending through the insulation layer 34 in the thickness-wise direction and removing the barrier film 33 exposed by the through holes by performing dry etching or wet etching. When removing the barrier film 33 through etching, conditions such as the etching liquid are set to etch the barrier film 33 without etching the metal layer 53.

When the via holes 34X are formed through laser processing, a desmearing process is perform to remove resin smears (resin residues) from the upper surface of the wiring layer 32 that is exposed by the via holes 34X.

Figure 5A:
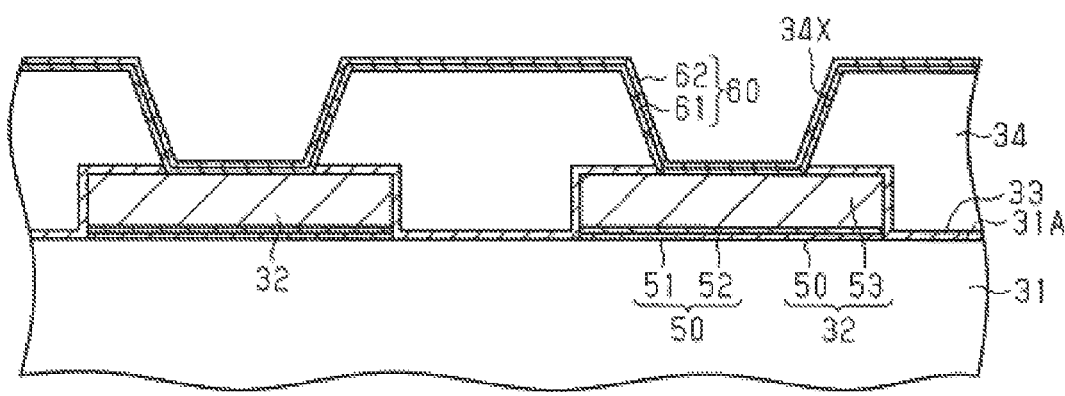

In the step illustrated in FIG. 5A, in the same manner as the step illustrated in FIG. 2A, the seed layer 60 is formed continuously covering the upper surface of the insulation layer 34 and the inner surface of each via hole 34X (inner side surface of insulation layer 34 and upper surface of wiring layer 32). For example, sputtering is performed to form the seed layer 60 having the double-layer structure of the metal film 61 (Ti layer) and the metal film 62 (Cu). Alternatively, electroless plating may be performed to form the seed layer 60.

Figure 5B:
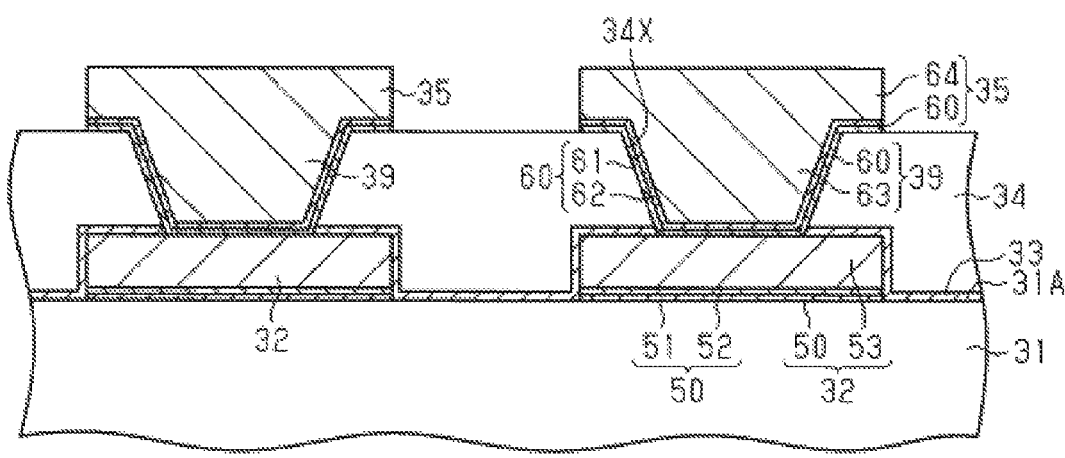

In the step illustrated in FIG. 5B, in the same manner as the steps illustrated in FIGS. 2B to 3C, the via wiring 39 filling the via holes 34X is formed. Further, the wiring layer 35 is formed on the insulation layer 34. The wiring layer 35 is electrically connected by the via wiring 39 to the wiring layer 32. The via wiring 39 includes the seed layer 60, which is formed on the inner surface of each via hole 34X, and the metal layer 63, which fills each via hole 34X that is covered by the seed layer 60. The wiring layer 35 includes the seed layer 60, which is formed on the upper surface of the insulation layer 34, and the metal layer 64, which is formed on the seed layer 60 and the metal layer 63.

The manufacturing steps described above obtain the structure illustrated in FIG. 1B. Although not described above, the barrier films 36, 43, and 46 illustrated in FIG. 1A may be formed in the same manner as the barrier film 33.

The present embodiment has the advantages described below.

(1) The barrier film 33, which covers the upper surface 31A of the insulation layer 31 and the upper surface and side surfaces of the wiring layer 32, is formed through the ALD process. In the ALD process, the film formation temperature is set to a low temperature of 90° C. or less. As a result, the barrier film 33 contains the same carbon atoms as the resin components of the insulation layer 34 formed on the barrier film 33. The carbon atoms contained in the barrier film 33 increases the strength of the adhesion between the barrier film 33 and the insulation layer 34. This reduces delamination at the interface of the barrier film 33 and the insulation layer 34, that is, at the interface of the wiring layer 32 and the insulation layer 34.

(2) Delamination is reduced at the interface of the barrier film 33 and the insulation layer 34, that is, the interface of the wiring layer 32 and the insulation layer 34. This reduces corrosion caused by oxidation or the like of the wiring layer 32 when conducting a reliability test such as the biased HAST.

(3) Corrosion of the wiring layer 32 is reduced. This reduces insulation deterioration between adjacent wires in the wiring layer 32. Further, increases are limited in the wiring resistance of the wiring layer 32.

(4) Corrosion of the wiring layer 32 is reduced. This limits the formation of irregularities in the surface of the wiring layer 32. Thus, the influence of the wiring layer 32 on the high-frequency transmission characteristics is limited.

[Experiment Results]

Experiments were conducted to prove that the strength of the adhesion between the barrier film 33 and the insulation layer 34 increased because of the carbon atoms contained in the barrier film 33. The experiment results will now be described.

First, the manufacturing steps illustrated in FIGS. 2A to 3C were performed to form the wiring layer 32 on the upper surface 31A of the insulation layer 31. The metal film 51 (Ti layer) had a thickness of 30 nm, the metal film 52 (Cu layer) had a thickness of 300 nm, and the metal layer 53 had a thickness of 2 μm. Further, the line and space of the wiring layer 32 was set to 2 μm/2 μm.

The ALD process was performed to form the barrier film 33 that covers the upper surface 31A of the insulation layer 31 and the upper surface and side surfaces of the wiring layer 32. In the ALD process, TMA was used as the precursor, and $H_2O$ was used as the reaction gas. Six types of samples were prepared by changing the film formation temperature of the ALD process to 30° C. (sample 1), 50° C. (sample 2), 80° C. (sample 3), 90° C. (sample 4), 110° C. (sample 5), and 130° C. (sample 6). Then, the insulation layer 34 was formed on the barrier film 33 of each of samples 1 to 6. In each of the samples 1 to 6, the barrier film 33 had a thickness of 5 nm, and the distance from the upper surface of the wiring layer 32 to the upper surface of the insulation layer 34 was 5 μm.

[Evaluation Method]

The biased HAST was conducted on the structure of each of samples 1 to 6. The biased HAST was conducted under the conditions in which the temperature was 130° C., the humidity was 85% RH, the applied voltage was 3.5 V, and the time was 96 hours. After conducting the biased HAST, a cross-section of the structure of each of the samples 1 to 6 was observed with a scanning ion microscope (SIM) to evaluate the delamination state at the interface of the barrier film 33 (wiring layer 32) and the insulation layer 34. Further, the SIM was used to evaluate the corrosion level of the wiring layer 32.

With regard to samples 1 to 6, the resistance of the insulation layer 34 between adjacent wires of the wiring layer 32 was measured before and after conducting the biased HAST. When the resistance of the insulation layer 34 is 1 MΩ or greater, the insulation reliability is of a practical level. Thus, when the resistance of the insulation layer 34 after conducting the biased HAST was 1 MΩ or greater, an OK determination (no insulation deterioration between wires) was given. When the resistance of the insulation layer 34 after conducting the biased HAST was less than 1 MΩ, an NG determination (insulation deterioration between wires) was given. Further, with regard to samples 1 to 6, the resistance of the wiring layer 32 was measured before and after conducting the biased HAST. When the changing rate (increase rate) of the resistance of the wiring layer 32 before and after conducting the biased HAST is 10% or less, the resistance has no influence on practical use. Thus, when the increase rate of the resistance of the wiring layer 32 before and after conducting the biased HAST was 10% or less, an OK determination (no change in wiring resistance) was given, and when the increase rate of the resistance of the wiring layer 32 before and after conducting the biased HAST was greater than 10%, an NG determination (change in wiring resistance) was given.

FIG. 11 illustrates the evaluation results for the four items described above. For each of the six types of the samples 1 to 6 illustrated in FIG. 11, five pieces were prepared. FIG. 11 illustrates the evaluation results of the five pieces for each of the six types of samples 1 to 6. The increase rate of the wiring resistance illustrates the average value of the evaluation result (increase rate of wiring resistance) for the five pieces prepared for each of the six types of samples 1 to 6. The carbon atom content rate in FIG. 11 is the carbon atom content rate at each film formation temperature obtained from the experiment results illustrated in FIG. 10.

[Evaluation Results]

As illustrated in FIG. 11, in sample 6, in which the film formation temperature of the ALD process was set at a high temperature of 130° C. (i.e., sample in which barrier film 33 does not contain carbon atoms), the occurrence of delamination at the interface of the barrier film 33 (wiring layer 32) and the insulation layer 34 was confirmed. Further, in sample 6, the occurrence of corrosion of the wiring layer 32 was confirmed. It is understood that the weak adhesion between the barrier film 33 and the insulation layer 34 in sample 6 caused delamination at the interface of the barrier film 33 (wiring layer 32) and the insulation layer 34, the delamination formed gaps that collected water during the biased HAST, and the water caused oxidation or the like leading to corrosion of the surface of the wiring layer 32. Further, in sample 6, deterioration between wires was confirmed in one of the five samples, and the increase rate of the wiring resistance was 10.8% (i.e., greater than or equal to 10%). It is understood that the corrosion of the surface of the wiring layer 32 decreased the resistance of the insulation layer 34 between adjacent wires in the wiring layer 32 and increased the resistance of the wiring layer 32.

In sample 5, in which the film formation temperature of the ALD process was set to 110° C., the insulation deterioration between wires and the increase rate of the wiring resistance were improved as compared with sample 6. It is understood that the carbon atoms contained in the barrier film 33 contributed to such improvements. However, in sample 5, like sample 6, delamination was confirmed at the interface of the barrier film 33 (wiring layer 32) and the insulation layer 34, and corrosion of the wiring layer 32 was confirmed.

In samples 1 to 4 in which the film formation temperature of the ALD process was set to 90° C. or less, delamination was not confirmed at the interface of the barrier film 33 (the wiring layer 32) and the insulation layer 34, and corrosion of the wiring layer 32 was not confirmed. It is understood that the amount of carbon atoms in the barrier film 33 that was larger than samples 5 and 6 prevented the occurrence of delamination and corrosion. When the carbon atom content rate of the barrier film 33 is 0.2 atomic % or greater, it is presumed that the strength of the adhesion between the barrier film 33 and the insulation layer 34 increases and reduces the occurrence of delamination at the interface of the barrier film 33 and the insulation layer 34. Further, in samples 1 to 4, reduction in the occurrence of delamination reduces the occurrence of corrosion of the wiring layer 32. Thus, improvement from samples 5 and 6 in the insulation deterioration between wires and the increase rate of the wiring resistance was confirmed.

The results of FIGS. 10 and 11 indicate that when forming the barrier film 33 in the ALD process under the film formation temperature of 90° C. or less, the carbon content rate of the barrier film 33 is 0.2% or greater. This increases the strength of the adhesion between the barrier film 33 and the insulation layer 34. In this manner, when setting the film formation temperature of the ALD process to 90° C. or less, the strength of the adhesion between the barrier film 33 and the insulation layer 34 may be increased as compared with when the film formation temperature is set to a temperature that is higher than 90° C. Further, when the carbon atom content rate of the barrier film 33 is 0.2 atomic % or greater, the strength of the adhesion between the barrier film 33 and the insulation layer 34 is increased as compared with when the barrier film 33 does not contain carbon atoms.

Accordingly, in the present embodiment, the film formation temperature of the ALD process is set to 90° C. or less so that the carbon atom content rate of the barrier film 33 is 0.2 atomic % to 10.0 atomic %. When the film formation temperature in the ALD process, or the temperature of the film formation compartment in the ALD apparatus, is set to less than 30° C., a cooling device becomes necessary to cool the film formation compartment. This increases production costs. Thus, from the viewpoint of productivity, it is preferred that the film formation temperature of the ALD process be in the range from 30° C. to 90° C. and that the carbon atom content rate of the barrier film 33 be in the range from 0.2 atomic % to 3.6 atomic %. The ALD apparatus includes tanks that hold the precursor or the reaction gas and a supply passage that connects the tanks to the film formation chamber to supply the film formation chamber with the precursor or the reaction gas from the tanks. The temperature of the supply passage is usually set to a high temperature of approximately 150° C. From the viewpoint of productivity, it is desirable that the temperature of the film formation chamber (film formation temperature) be as close as possible to the temperature of the supply passage. Thus, from the viewpoint of productivity, it is further preferred that the film formation temperature in the ALD process be set in the range of 50° C. to 90° C. and further preferred that the carbon atom content rate of the barrier film 33 be in the range from 0.2 atomic % to 2.0 atomic %.

It should be apparent to those skilled in the art that the foregoing embodiments may be employed in many other specific forms without departing from the scope of this disclosure. Particularly, it should be understood that the foregoing embodiments may be employed in the following forms.

In the wiring substrate 10 of the above embodiment, a barrier film may be formed to cover the upper surface of the core substrate 20 and the upper surface and side surfaces of the wiring layer 22. Further, a barrier film may be formed to cover the lower surface of the core substrate 20 and the lower surface and side surfaces of the wiring layer 23.

In the above embodiment, TMA is used as the precursor and $H_2O$ is used as the reaction gas in the ALD process to form the barrier film 33. Instead, for example, TMA may be used as the precursor and ozone ($O_3$) may be used as the reaction gas to form the barrier film 33. In this case, the film formation temperature in the ALD process is set to 90° C. or less so that the barrier film 33 contains carbon atoms in the same manner as the above embodiment.

The barrier film 33 may be formed in a plasma ALD process that uses TMA as a precursor and $H_2O$ or $O_3$ as a reaction gas. In this case, the film formation temperature in the plasma ALD process may be set to 90° C. or less so that the barrier film 33 contains carbon atoms in the same manner as the above embodiment.

The barrier film 33 (i.e., alumina film) may be formed through high-frequency (RF) sputtering or direct current (DC) sputtering. For example, in RF sputtering, an alumina target is sputtered with Ar ions to form an alumina film. In this case, gas containing carbon atoms such as CO or $CO_2$ may be added to Ar gas to form an alumina film (barrier film 33) that contains carbon atoms. In DC sputtering, an aluminum target is sputtered with Ar ions to form an alumina film. In this case, gas containing carbon atoms such as CO or $CO_2$ may be added to Ar gas to form an alumina film (barrier film 33) that contains carbon atoms. In the RF sputtering and the DC sputtering, it is preferred that the amount of CO or $CO_2$ added to the AR gas be adjusted so that the carbon atom content rate of the barrier film 33 is in the range from 0.2 atomic % to 10.0 atomic % (preferably in the range from 0.2 atomic % to 3.6 atomic % and further preferably in the range from 0.2 atomic % to 2.0 atomic %).

In the above embodiment, the material of the insulation layer 31, which serves as the underlayer of the wiring layer 32, is not limited to resin. For example, the insulation layer 32 may be formed from an inorganic insulative material such as silicon oxide, silicon nitride, silicon carbide, alumina, and aluminum nitride. The insulation layer 31 of such an inorganic insulative material may be formed through, for example, thermal oxidation, CVD, an ALD process, sputtering, a sol-gel process, or sintering.

In the wiring structure 30 of the above embodiment, the number of layers and the wiring layout of the wiring layers 32 and 35 and the insulation layers 31 and 34 may be changed.

In the wiring structure 40 of the above embodiment, the number of layers and the wiring layout of the wiring layers 42 and 45 and the insulation layers 41 and 44 may be changed.

In the wiring substrate 10 of the above embodiment, the solder resist layers 37 and 47 may be omitted.

In the above embodiment, the wiring substrate 10 includes the core substrate 20 but does not have to include the core substrate 20.

The above embodiment and the modifications may be appropriately combined.

Clauses

This disclosure further encompasses the following embodiments.

1. A method for manufacturing a wiring substrate, the method including:

forming a first wiring layer on an upper surface of a first insulation layer;

forming a barrier film that covers the upper surface of the first insulation layer, an upper surface of the first wiring layer, and side surfaces of the first wiring layer; and forming a second insulation layer that covers an upper surface of the barrier film and side surfaces of the barrier film;

wherein the barrier film is formed through an atomic layer deposition (ALD) process that uses trimethylaluminium (TMA) as a precursor and $H_2O$ or $O_3$ as a reaction gas at a film formation temperature set to 90° C. or less.

2. The method according to clause 1, wherein the forming a barrier film includes setting the film formation temperature of the ALD process to a range from 30° C. to 90° C.

3. The method according to clause 1, wherein the forming a barrier film includes setting the film formation temperature of the ALD process to a range from 50° C. to 90° C.

4. The method according to any one of clauses 1 to 3, further including:

forming a via hole that extends through the second insulation layer and the barrier film in a thickness-wise direction and exposes a portion of the upper surface of the first wiring layer;

forming a via wiring with which the via hole is filled; and forming a second wiring layer on the via wiring and on the second insulation layer, wherein the second wiring layer is electrically connected to the first wiring layer by the via wiring.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A wiring substrate comprising:
    a first insulation layer;
    a wiring layer formed on an upper surface of the first insulation layer;
    a barrier film that covers the upper surface of the first insulation layer, an upper surface of the wiring layer, and side surfaces of the wiring layer; and
    a second insulation layer that covers an upper surface of the barrier film and side surfaces of the barrier film;
    wherein the barrier film is an alumina film containing carbon atoms, and the alumina film has a carbon atom content rate in the range of 0.2 atomic % to 3.6 atomic %.

2. The wiring substrate according to claim 1, wherein the carbon atom content rate of the alumina film is in the range of 0.2 atomic % to 2.0 atomic %.

3. The wiring substrate according to claim 1, wherein the alumina film includes a $CH_X$ group bonded to an Al atom in the alumina film.

4. The wiring substrate according to claim 1, wherein the wiring layer has a line and space of 2 μm/2 μm or less.

5. The wiring substrate according to claim 1, wherein the first insulation layer and the second insulation layer are each formed from one of a thermosetting insulative resin, a photosensitive insulative resin, and an inorganic insulative material.

* * * * *